(12) United States Patent
Kim et al.

(10) Patent No.: US 9,117,776 B2
(45) Date of Patent: Aug. 25, 2015

(54) ORGANIC LIGHT-EMITTING DISPLAY AND METHOD OF MANUFACTURING THE SAME

(71) Applicant: Samsung Display Co., Ltd., Yongin, Gyeonggi-Do (KR)

(72) Inventors: Hyun-Ho Kim, Yongin (KR); Seung-Yong Song, Yongin (KR); Sang-Hwan Cho, Yongin (KR); Soo-Youn Kim, Yongin (KR); Seung-Hun Kim, Yongin (KR); Sang-Hyun Park, Yongin (KR); Cheol Jang, Yongin (KR); Chung-Sock Choi, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/089,531

(22) Filed: Nov. 25, 2013

(65) Prior Publication Data
US 2015/0028294 A1  Jan. 29, 2015

(30) Foreign Application Priority Data

Jul. 25, 2013  (KR) ......................... 10-2013-0088274

(51) Int. Cl.
*H01L 21/00* (2006.01)
*H01L 27/32* (2006.01)
*H01L 51/56* (2006.01)

(52) U.S. Cl.
CPC ............. *H01L 27/322* (2013.01); *H01L 51/56* (2013.01)

(58) Field of Classification Search
CPC ................... G02F 2202/023; G02F 2202/046; G02F 222/025

USPC ................................ 257/50; 438/35; 345/205
See application file for complete search history.

(56) References Cited

U.S. PATENT DOCUMENTS

| 4,282,290 | A | * | 8/1981 | Pellicori et al. | ................ | 428/472 |
| 5,980,768 | A | * | 11/1999 | Abraham | ......................... | 216/67 |
| 7,223,515 | B1 | * | 5/2007 | Wolk et al. | ..................... | 430/200 |
| 2005/0033072 | A1 | | 2/2005 | Yam et al. | | |
| 2006/0226400 | A1 | | 10/2006 | Xiao et al. | | |

(Continued)

FOREIGN PATENT DOCUMENTS

| JP | 10039293 A | * | 2/1998 | ............ G02F 1/1335 |
| KR | 10-2006-0117301 A | | 11/2006 | |

(Continued)

OTHER PUBLICATIONS

Translation of JP10-39293 (Iwata et al ) , (Feb. 1998) 7 pages.*

(Continued)

*Primary Examiner* — Caridad Everhart
(74) *Attorney, Agent, or Firm* — Knobbe Martens Olson & Bear LLP

(57) ABSTRACT

Organic light-emitting displays and methods of manufacturing the same are disclosed. An organic light-emitting display includes a substrate; a display panel provided on the substrate, the display panel having an emission area in which an organic light-emitting device is provided and a non-emission area that separates the emission area; and a color-changing material layer provided on the display panel, wherein the color-changing material layer includes a light-transmission part corresponding to the emission area and a light-blocking part corresponding to the non-emission area.

20 Claims, 7 Drawing Sheets

(56) References Cited

U.S. PATENT DOCUMENTS

2006/0226523 A1* 10/2006 Foust et al. .................. 257/680
2012/0224244 A1   9/2012 Park et al.
2012/0319122 A1  12/2012 Ma

FOREIGN PATENT DOCUMENTS

| KR | 10-2006-0135425 A | | 12/2006 | |
| --- | --- | --- | --- | --- |
| KR | 102006013541 A | * | 12/2006 | ............ G02F 1/1335 |
| KR | 10-2008-0000629 A | | 1/2008 | |
| KR | 10-2010-0026239 A | | 3/2010 | |
| KR | 10-2011-0115386 A | | 10/2011 | |
| KR | 10-1069699 B1 | | 10/2011 | |
| KR | 10-2012-0092907 A | | 8/2012 | |
| KR | 10-2012-0101262 A | | 9/2012 | |
| KR | 10-2012-0139388 A | | 12/2012 | |
| WO | WO0211209 A | * | 7/2002 | .............. H01L 27/00 |

OTHER PUBLICATIONS

Trygve Mongstad et al., "A new film photochromic material: Oxygen-containing yttrium hydride," *Sol. Energy Mater. Sol. Cells* 2011 (accepted), DOI: 10.1016/j.solmat.2011.08.018, pp. 1-8.

* cited by examiner

ORGANIC LIGHT-EMITTING DISPLAY AND METHOD OF MANUFACTURING THE SAME

CROSS-REFERENCE TO RELATED APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0088274 in the Korean Intellectual Property Office on Jul. 25, 2013, the disclosure of which is incorporated herein by reference in its entirety.

BACKGROUND

1. Field

This invention relates to an organic light-emitting display and a method of manufacturing the same, and particularly, to an organic light-emitting display including a color-changing material layer and a method of manufacturing the same.

2. Description of the Related Technology

An organic light-emitting display is a self-emission type display including an organic light-emitting device, which includes a hole injection electrode, an electron injection electrode, and an organic emission layer formed therebetween. The organic light emitting light when excitons drop from an excited state to a ground state, and the excitons are generated when holes injected from the hole injection electrode and electrons injected from the electron injection electrode are bonded in the organic emission layer.

Because the organic light-emitting display is self-emission, it does not need a separate light source. Thus, the organic light-emitting display may be operated at a low voltage, and also in lightweight and thin. It has attracted attention as a next-generation display due to superior characteristics, such as wide angle of views, high contrast, quick response speeds, and the like.

SUMMARY OF CERTAIN INVENTIVE ASPECTS

One aspect of the disclosure relates to an organic light-emitting display and a method of manufacturing the same, and more particularly, to an organic light-emitting display that has improved visibility and a method of manufacturing the same which is simplified.

Another aspect of the disclosure relates to an organic light-emitting display includes: a substrate; a display panel provided on the substrate, the display panel having an emission area in which an organic light-emitting device is provided and a non-emission area that separates the emission area; and a color-changing material layer provided on the display panel, wherein the color-changing material layer includes a light-transmission part corresponding to the emission area and a light-blocking part corresponding to the non-emission area.

The color-changing material layer may have a light transmissivity that irreversibly changes in response to ultraviolet rays irradiation.

The color-changing material layer may have a light transmissivity that irreversibly changes in response to a temperature between about 80° C. and about 100° C.

The organic light-emitting display may further include an ultraviolet blocking layer on the color-changing material layer.

The organic light-emitting display may further include a thin film encapsulation for sealing up the display panel.

The thin film encapsulation may include at least one organic layer, or at least one organic layer and at least one inorganic layer, wherein the color-changing material layer may be included in the thin film encapsulation.

The organic light-emitting display may further include an external light reflection preventing layer provided on the display panel.

The external light reflection preventing layer may include at least one semi-transmissive metal layer and at least one dielectric layer.

The organic light-emitting display may further include a thin film encapsulation for sealing up the display panel; and an external light reflection preventing layer on the thin film encapsulation, wherein the color-changing material layer is disposed on the external light reflection preventing layer.

The organic light-emitting display may further include a sealing substrate for sealing up the display panel; and a sealing member for bonding the substrate and the sealing substrate.

The color-changing material layer may be disposed on an upper or a lower surface of the sealing substrate.

The color-changing material layer may include at least one material selected from the group consisting of diarylethene derivatives, naphthopyran derivatives, polyurethanes, spirobenzopyran compounds, spiroxazine compounds, and any combinations thereof.

Another aspect of the disclosure relates to a method of manufacturing an organic light-emitting display includes forming a display panel on a substrate, the display panel including an emission area and a non-emission area that separates the emission area; and forming a color-changing material layer on the display panel, the color-changing material layer including a light-transmission part and a light-blocking part.

The light-transmission part may correspond to the emission area and the light-blocking part may correspond to the non-emission area.

The forming of the color-changing material layer, including the light-transmission part and the light-blocking part, may include forming a pre-color-changing material layer on the display panel; and irradiating ultraviolet rays on a selective region of the pre-color changing material layer.

The forming of the color-changing material layer including the light-transmission part and the light-blocking part may include forming a pre-color-changing material layer on the display panel; and applying heat to a selective region of the pre-color-changing material layer.

The method may further include forming a thin film encapsulation for sealing up the display panel, wherein the forming of the color-changing material layer is included in the forming of the thin film encapsulation.

The method may further include forming an ultraviolet blocking layer on the color-changing material layer.

The method may further include forming an external light reflection preventing layer on the display panel.

The external light reflection preventing layer may include at least one semi-transmissive metal layer and at least one dielectric layer.

The method may further include bonding a sealing substrate for sealing up the display panel and the substrate, wherein the color-changing material layer is formed on the sealing substrate.

Additional aspects will be set forth in part in the description which follows and, in part, will be apparent from the description, or may be learned by practice of the presented embodiments.

DETAILED DESCRIPTION OF CERTAIN INVENTIVE EMBODIMENTS

Figure 1:
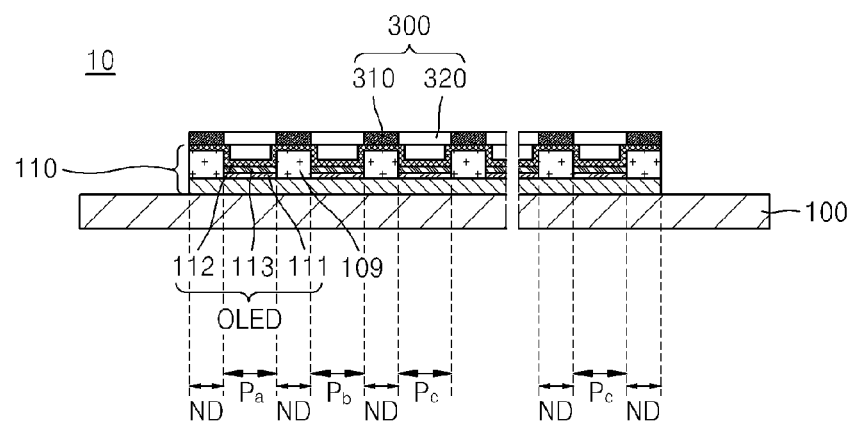
FIG. 1 is a schematic cross-sectional view of an organic light-emitting display.

Reference will now be made in detail to embodiments, examples of which are illustrated in the accompanying drawings, wherein like reference numerals refer to like elements throughout, and thus their repetitive description will be omitted. In addition, the sizes of components may be exaggerated for clarity and convenience of description.

The embodiments described below are only illustrative, and various changes and modifications of the embodiments described herein can be made. For example, when a layer is referred to as being "formed on" another layer, it can be directly or indirectly formed on the other layer. That is, for example, intervening layers, may be present.

The terminology used in the application is used only to describe embodiments and does not have any intention to limit the present disclosure. As used herein, the singular forms "a", "an", and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. It will be understood that although the terms "first", "second", etc. may be used herein to describe various components, these components should not be limited by these terms. These components are only used to distinguish one component from another.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Figure 2:
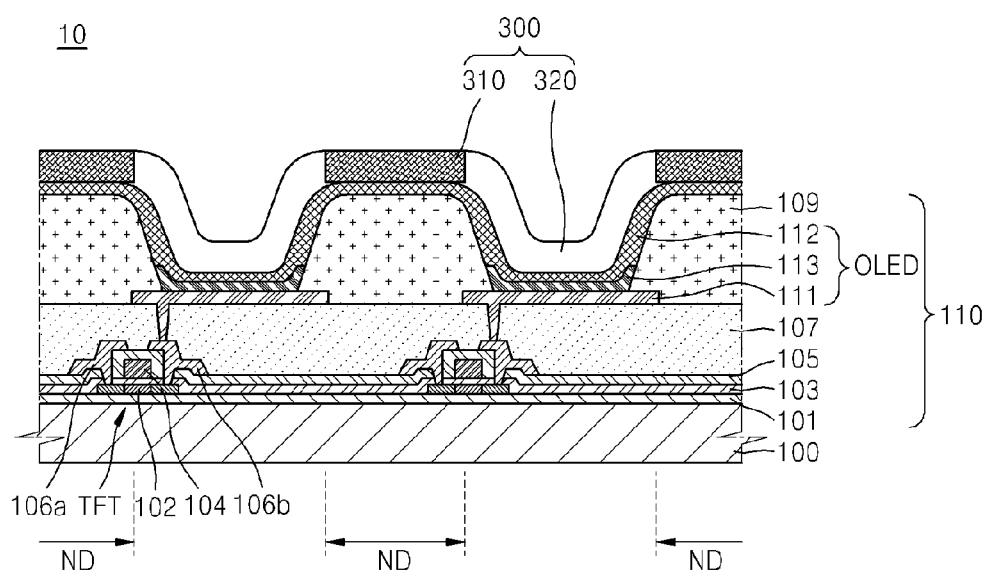
FIG. 2 is a magnified cross-sectional view of a portion of the organic light-emitting display of FIG. 1.

FIG. 1 is a schematic cross-sectional view of an organic light-emitting display 10. FIG. 2 is a magnified cross-sectional view of a portion of the organic light-emitting display 10 of FIG. 1.

Referring to FIGS. 1 and 2, the organic light-emitting display 10 may include a substrate 100, a display panel 110, and a color-changing material layer 300.

The display panel 110 is provided on the substrate 100 and includes an emission area (Pa, Pb, and Pc) in which an organic light-emitting device is provided and a non-emission area ND that separates the emission area (Pa, Pb, and Pc).

The emission area (Pa, Pb, and Pc) may be referred to as a pixel area including a first pixel Pa, a second pixel Pb, and a third pixel Pc expressing different colors. In some embodiments, for example, the first pixel Pa may be a red pixel, the second pixel Pb may be a green pixel, and the third pixel Pc may be a blue pixel. However, the present disclosure is not limited thereto. For example, the emission area (Pa, Pb, and Pc) may be formed with a white pixel. Alternatively, the emission area (Pa, Pb, and Pc) may further include a white pixel in addition to red, green, and blue pixels.

In some embodiments, the color-changing material layer 300 may be provided to form a light-blocking part 310 functioning as a black matrix through a simple process.

The color-changing material layer 300 may include a light-transmission part 320 and the light-blocking part 310. The light-transmission part 320 is disposed to correspond to the emission area (Pa, Pb, and Pc) of the display panel 110, and the light-blocking part 310 is disposed to correspond to the non-emission area ND. Although FIG. 1 shows that the light-blocking part 310 and the light-transmission part 320 of the color-changing material layer 300 form the same plane, the present disclosure is not limited thereto. The color-changing material layer 300 may be unevenly disposed along shapes of components disposed below the color-changing material layer 300, as shown in FIG. 2. Between the display panel 110 and the color-changing material layer 300, additional layers, such as a thin film encapsulation (not shown), a protective layer (not shown), and/or a planarization layer (not shown), may be further included.

The light-transmission part 320 of the color-changing material layer 300 transmits light emitted from the emission area (Pa, Pb, and Pc). The light-blocking part 310 of the color-changing material layer 300 may absorb visible rays incident from the outside and prevent color-mixing and interference of visible rays from the emission area (Pa, Pb, and Pc) to thereby improve the contrast of the organic light-emitting display 10.

The color-changing material layer 300 includes a photochromic material or a thermochromic material.

The photochromic material is a material of which a light transmissivity changes in response to light. In some embodiments, the color-changing material layer 300 may have a light transmissivity that changes in response to a predetermined wavelength of ultraviolet rays irradiation or a laser beam having a predetermined power or above.

The thermochromic material is a material of which a light transmissivity changes in response to a temperature. In some embodiments, the color-changing material layer 300 may have a light transmissivity that changes in response to a temperature between about 80° C. and about 100° C.

In general, a color-changing material includes a reversible color-changing material of which a light transmissivity varies due to irradiation of a predetermined light or a predetermined temperature and that returns to an original state and an irreversible color-changing material that maintains a changed state of light transmissivity without returning to the original state.

The color-changing material layer 300 applied to herein may include an irreversible photochromic material or an irreversible thermochromic material. In some embodiments, the color-changing material layer 300 may include a photochromic material of which a light transmissivity irreversibly varies in reaction to ultraviolet rays. In some embodiments, the color-changing material layer 300 may include at least one material selected from among diarylethene derivatives, naphthopyran derivatives, polyurethanes, spirobenzopyran compounds, and a spiroxazine compounds. In some embodiments, the color-changing material layer 300 may include a thermochromic material of which a light transmissivity irreversibly changes in response to a temperature between about 80° C. and about 100° C.

The color-changing material included in the color-changing material layer 300 may be a positive type in which the color-changing material originally has a transmission property and is changed to an absorption property due to light or heat, or may be a negative type in which the color-changing material originally has an absorption property and is changed to a transmission property due to light or heat. Accordingly, the color-changing material layer 300 having the light-blocking part 310 and the light-transmission part 320 may be formed by selectively irradiating on or locally applying heat to a partial region of a pre-color changing material layer (300', refer to FIG. 11B).

A configuration of the organic light-emitting display 10 will now be described in more detail with reference to FIG. 2.

The substrate 100 may be formed of a transparent glass material having silicon oxide ($SiO_2$) as a main component. The substrate 100 is not limited thereto and may be formed of a transparent plastic material. The transparent plastic material forming the substrate 100 may be an insulating organic material. The organic material can be selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (CTA), cellulose acetate propionate (CAP), and any combinations thereof.

When the organic light-emitting display 10 is a bottom emission type display for displaying an image in a direction towards the substrate 100, the substrate 100 may be formed of a transparent material. However, when the organic light-emitting display 10 is a top emission type in a direction towards for displaying an image in a direction away from the substrate 100, the substrate 100 does not have to be formed of a transparent material and may be formed of a ceramic or metallic material. For example, the substrate 100 may include at least one selected from the group consisting of carbon (C), iron (Fe), chromium (Cr), manganese (Mn), nickel (Ni), titanium (Ti), molybdenum (Mo), stainless steel (SUS), and any combinations thereof. However, the substrate 100 is not limited thereto, and the substrate 100 may be formed of a metallic foil.

An auxiliary layer 101, such as a barrier layer, a blocking layer, and/or a buffer layer may be provided on the substrate 100 for preventing the diffusion of impurity ions, preventing the infiltration of humidity and air, and planarizing the surface of the substrate 100. The auxiliary layer 101 may be formed of at least one of $SiO_2$, silicon nitride ($SiN_x$), and silicon oxynitride ($SiO_xN_y$). The auxiliary layer 101 may be deposited by various deposition methods, such as a plasma-enhanced chemical vapor deposition (PECVD) method, an atmospheric pressure CVD (APCVD) method, a low pressure CVD (LPCVD) method, and the like. The auxiliary layer 101 is not mandatory and may be omitted according to circumstances.

The display panel 110 is provided on the substrate 100. The display panel 110 includes a thin film transistor TFT and an organic light-emitting device OLED. Although FIG. 2 shows only one thin film transistor TFT for each pixel, this is only for convenience of description, and the disclosure is not limited to one thin film transistor TFT for each pixel and may further include a plurality of thin film transistors TFT and a storage capacitor for each pixel.

The plurality of thin film transistors TFT are electrically connected to the organic light-emitting device to drive the device OLED. The thin film transistor TFT shown in FIG. 2 is a top gate type transistor that sequentially includes an active layer 102, a gate electrode 104, a source electrode 106a and a drain electrode 106b. Although the thin film transistor TFT of a top gate type is disclosed in the current embodiment, it will be understood by those of ordinary skill in the art that the present disclosure is not limited to the shape of the thin film transistor TFT shown in FIG. 2 and may employ various types of thin film transistors TFT.

The active layer 102 may be formed by forming an inorganic semiconductor, such as an oxide semiconductor, or an organic semiconductor on the auxiliary layer 101 across the whole surface of the substrate 100 and then patterning the formed inorganic or organic semiconductor.

In some embodiments, the active layer 102 may be formed of silicon. In this case, the active layer 102, including a source region, a drain region, and a channel region therebetween, may be formed by forming an amorphous silicon layer on the whole surface of the substrate 100, forming a polycrystalline silicon layer by crystallizing the amorphous silicon layer, patterning the polycrystalline silicon layer, and doping the source region and the drain region at edges of the channel region with impurities.

In some embodiments, the active layer 102 may be formed of an oxide semiconductor. For example, the oxide semiconductor may include a Group 12, 13, or 14 metallic element, such as zinc (Zn), indium (In), gallium (Ga), tin (Sn), cadmium (Cd), germanium (Ge), or an oxide of a material selected therefrom. The oxide semiconductor may also include hafnium (Hf) or an oxide thereof.

The source region and the drain region are formed at both edges of the active layer 102 and may be respectively connected to the source electrode 106a and the drain electrode 106b. A gate insulating layer 103 is formed on the active layer 102, and the gate electrode 104 is formed on a predetermined region of the gate insulating layer 103. The gate electrode 104 is connected to a gate line (not shown) through which an on/off signal of the thin film transistor TFT is applied.

An interlayer insulating layer 105 is formed on the gate electrode 104, and the source electrode 106a and the drain electrode 106b respectively contact the source region and the drain region of the active layer 102 through contact holes in the interlayer insulating layer 105.

The gate insulating layer 103 and the interlayer insulating layer 105 may be formed as an insulator. For example, the gate insulating layer 103 and the interlayer insulating layer 105 may be formed of an inorganic material, an organic material, or a combination of organic and inorganic complex in a single-layer or a multi-layer structure. In some embodiments, the gate insulating layer 103 and the interlayer insulating layer 105 may be formed of $SiN_x$ or $SiO_2$.

A planarization layer 107 may function to cover and protect the thin film transistor TFT and/or may function to remove the level difference and perform planarization to increase the emission efficiency of the organic light-emitting device to be formed thereon. An inorganic insulating layer and/or an organic insulating layer may be used as the planarization layer 107. The inorganic insulating layer may include $SiO_2$, SiNx, SiON, aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), lead zirconate titanate (PZT), or the like. The organic insulating layer may include a typical general-use polymer (polymethylmethacrylate (PMMA) or polystyrene (PS)), a polymer derivative having a phenol group, an acryl group polymer, an imide group polymer, an aryl ether group polymer, an amide group polymer, a fluorine group polymer, a p-xylene group polymer, a vinyl alcohol group polymer, a blend thereof, or the like. The planarization layer 107 may be formed as a stacked body of the inorganic insulating layer and the organic insulating layer.

The organic light-emitting device is provided on the planarization layer 107 in a pixel area or an emission area. The emission area and the non-emission area (ND) will be described below when a pixel defining layer 109 is described.

The organic light-emitting device includes an anode electrode 111 connected to any one of the source electrode 106a and the drain electrode 106b, a cathode electrode 112 formed to face the anode electrode 111, and an organic emission layer 113 disposed therebetween.

On the planarization layer 107, the anode electrode 111 of the organic light-emitting device is formed, and the pixel defining layer 109 is formed as an insulating material that covers the anode electrode 111. The pixel defining layer 109 may be formed of polyacrylates, polyimides, benzocyclobutene, a resin, such as phenol, inorganic material containing a silica group, or the like. In some embodiments, the pixel defining layer 109 may be formed by spin coating.

After a predetermined aperture that exposes the central part of the anode electrode 111 is formed in the pixel defining layer 109, the organic emission layer 113 of the organic light-emitting device may be formed. The cathode electrode 112 of the organic light-emitting device is formed to cover all pixels.

A pixel is defined by the aperture of the pixel defining layer 109, and one organic light-emitting device is disposed for each pixel. That is, an emission region due to the organic emission layer 113 is formed in the aperture of the pixel defining layer 109, and the emission region is separated by the pixel defining layer 109 that is the non-emission region ND.

The anode electrode 111 may be provided as a transparent electrode or a reflective electrode. When the anode electrode 111 is provided as a transparent electrode, the anode electrode 111 may include an indium tin oxide (ITO), an indium zinc oxide (IZO), a zinc oxide (ZnO), or an indium oxide ($In_2O_3$). When the anode electrode 111 is provided as a reflective electrode, the anode electrode 111 may include a reflective layer formed of silver (Ag), magnesium (Mg), Al, platinum (Pt), palladium (Pd), gold (Au), Ni, neodymium (Nd), iridium (Ir), chromium (Cr), or a compound thereof and a transparent layer formed of ITO, IZO, ZnO, or $In_2O_3$. In some embodiments, the anode electrode 111 may have an ITO/Ag/ITO structure as a reflective electrode.

The cathode electrode 112 may also be provided as a transparent electrode or a reflective electrode. When the cathode electrode 112 is provided as a transparent electrode, the cathode electrode 112 may include a film formed by a depositing lithium (Li), calcium (Ca), lithium fluoride (LiF)/Ca, LiF/Al, Al, Mg, or a compound thereof towards the organic emission layer 113, an auxiliary electrode formed of a transparent conductive material, such as ITO, IZO, ZnO, $In_2O_3$, or the like, on the film, and a bus electrode line. When the cathode electrode 112 is provided as a reflective electrode, the cathode electrode 112 may be formed of Li, Ca, LiF/Ca, LiF/Al, Al, Mg, or a compound thereof. In some embodiments, positions of the anode electrode 111 and the cathode electrode 112 may be exchanged.

The organic emission layer 113 provided between the anode electrode 111 and the cathode electrode 112 may be formed of a low-molecular organic material or a high-molecular organic material. When a low-molecular organic material is used, a hole injection layer (HIL) (not shown), a hole transport layer (HTL) (not shown), an electron transport layer (ETL) (not shown), an electron injection layer (EIL) (not shown), and the like may be stacked as a single layer or multiple layers on or below the organic emission layer 113, and various organic materials, such as copper phthalocyanine (CuPc), N,N'-di(naphthalene-1-yl)-N,N'-diphenyl-benzidine (NPB), tris-8-hydroxyquinoline aluminum ($Alq_3$), and the like, are applicable. These low-molecular organic materials may be formed by vacuum deposition using masks.

When the organic emission layer 113 is formed of a high-molecular organic material, the organic emission layer 113 may have a structure in which the HTL is further provided towards the anode electrode 111 from the organic emission layer 113, wherein poly(3,4)-ethylenedioxythiophene (PEDOT) is used as the HTL, and a high-molecular organic material, such as polyphenylene vinylene (PPV) or polyfluorene, is used as the organic emission layer 113. The organic emission layer 113 may emit any one of red, green, blue, or white light.

Although FIG. 2 shows that the organic emission layer 113 is only in the aperture of the pixel defining layer 109, the device described herein is not limited thereto. For example, the organic emission layer 113 may be formed on the anode electrode 111 in the aperture of the pixel defining layer 109 or may be disposed between the pixel defining layer 109 and the cathode electrode 112.

Although a case where a separate emission material is formed for each pixel with the organic emission layer 113 formed in the aperture has been described as an example, the device described herein is not limited thereto. The organic emission layer 113 may be commonly formed on the whole planarization layer 107 regardless of the position of each pixel. In this case, the organic emission layer 113 may be formed to emit white light by mixing emission materials for emitting red, green, and blue lights. Further, the organic emission layer 113 may be formed by vertically stacking layers for emitting red, green, and blue lights. Alternatively, the organic emission layer 113 may be formed by mixing emission materials for expressing various colors to emit white light or by stacking emission material layers for expressing various colors to emit white light.

A protective layer (not shown) for covering and protecting the organic light-emitting device may be further provided on the organic light-emitting device OLED.

The organic light-emitting display 10 may further include at least one of an ultraviolet blocking layer 350, a thin film encapsulation 210, an external light reflection preventing layer 400, a sealing substrate 200, and a sealing member 510, as described with reference to FIGS. 3 to 10.

Figure 3:
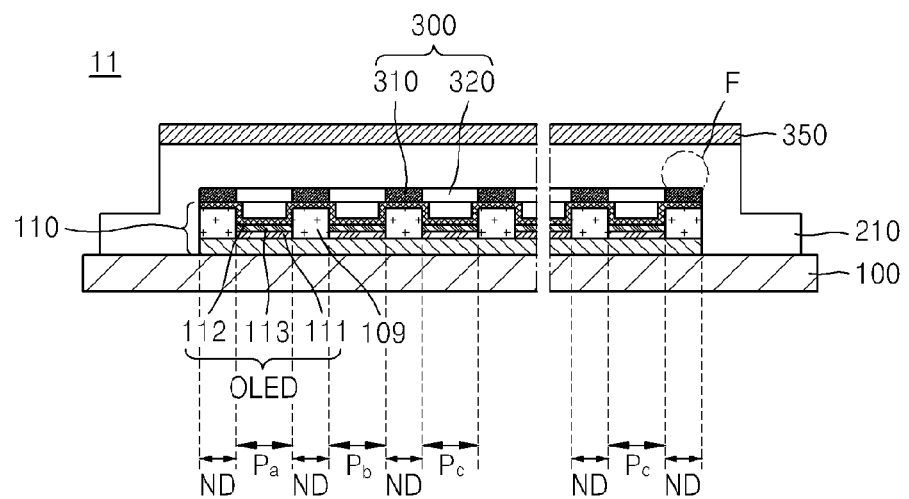
FIG. 3 is a schematic cross-sectional view of an organic light-emitting display.
Figure 4:
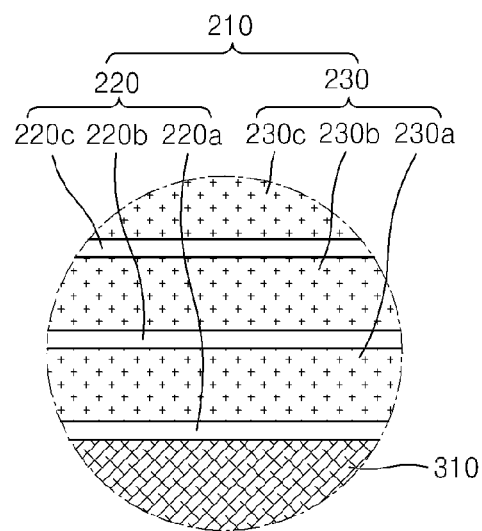
FIG. 4 is a magnified view of region F of FIG. 3.
Figure 5:
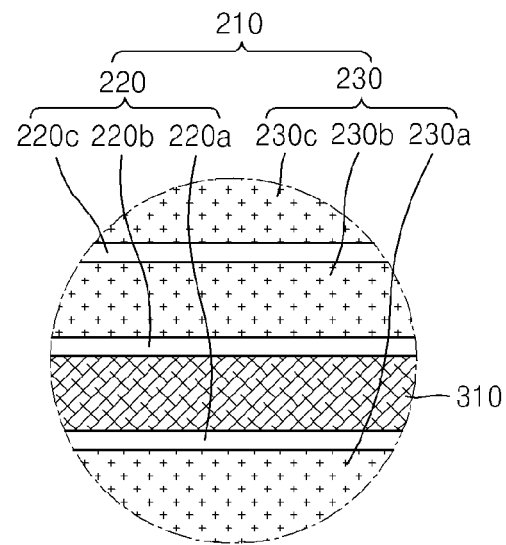
FIG. 5 is a magnified view of the region F of FIG. 3.

FIG. 3 is a schematic cross-sectional view of an organic light-emitting display 11 according to another embodiment of the present invention. FIG. 4 is a magnified view of region F of FIG. 3, according to an embodiment of the present invention. FIG. 5 is a magnified view of the region F of FIG. 3, according to another embodiment of the present invention.

In FIG. 3, the same or similar reference numerals in FIG. 1 refer to the same members, and thus their repeated description is omitted for convenience of description.

Referring to FIG. 3, compared with the organic light-emitting display 10, the organic light-emitting display 11 differs from the organic light-emitting display 10 in that the organic light-emitting display 11 further includes at least one of the ultraviolet blocking layer 350 and the thin film encapsulation 210.

In some embodiments. the ultraviolet blocking layer 350 may function to block ultraviolet rays which may be incident from the outside. Accordingly, when the color-changing material layer 300 includes a photochromic material, no ultraviolet rays reach the light-transmission part 320, and thus discoloration of the light-transmission part 320 may be prevented. In addition, the ultraviolet blocking layer 350 may function to block ultraviolet rays which may damage various organic materials forming the organic light-emitting display 11.

The ultraviolet blocking layer 350 may be provided as the uppermost layer of the organic light-emitting display 11 but is not limited thereto. For example, the ultraviolet blocking layer 350 may be provided on the color-changing material layer 300. Alternatively, the ultraviolet blocking layer 350 may be formed to surround the color-changing material layer 300 and side surfaces of the display panel 110.

The ultraviolet blocking layer 350 may include an organic material that absorbs ultraviolet rays or an inorganic material that disperses ultraviolet rays. The organic material may be one selected from the group consisting of salicylic acid, benzotriazole, benzophenone, and cyanoacrylate having a group that is capable of absorbing ultraviolet rays. The inorganic material may be one selected from the group consisting of $TiO_2$, ZnO, $ZrO_2$, and a cerium oxide as a metal having a high refractive index.

The thickness of the ultraviolet blocking layer 350 may be designed by considering enough transparency to block ultraviolet rays and transmit visible rays. In some embodiments, the thickness of the ultraviolet blocking layer 350 may be in a range of about 0.5 μm to 7 μm.

The ultraviolet blocking layer 350 may be formed as a uniform thin film by a typical method using the materials described above. For example, a wet method, such as spin coating, dip coating, spraying, or screen printing, or a dry method, such as oxygen ion beam deposition, chemical mist deposition (CMD), or CVD, may be used.

The thin film encapsulation 210 is provided to cover the display panel 110 and seals up the display panel 110. The thin film encapsulation 210 may function to block the display panel 110, including the organic light-emitting device, from external humidity and air.

Referring to FIG. 4, the thin film encapsulation 210 may include at least one of an inorganic layer 220 and an organic layer 230. The inorganic layer 220 may include first, second, and third inorganic layers 220a, 220b, and 220c, and the organic layer 230 may include first, second, and third organic layers 230a, 230b, and 230c. Although FIG. 4 shows a structure in which the inorganic layer 220 and the organic layer 230 are alternately stacked, the present disclosure is not limited thereto.

The organic layer 230 is formed of a polymer and may be a single layer or stacked layers formed of any one of polyethylene (PET), polyimide, Polycarbonates (PC), epoxy, and PAR (polyacrylates). In another embodiments, the organic layer 230 may be formed of PAR, in detail, which is the polymerization product of a monomer composite including a diacrylate group monomer and a triacrylate group monomer. The monomer composite may further include a monoacrylate group monomer. In addition, the monomer composite may further include a well-known photoinitiator, such as TPO, but is not limited thereto.

The inorganic layer 220 may be a single layer or stacked layers including a metal oxide or a metal nitride. In detail, the inorganic layer 220 may include any one of $SiN_x$, $Al_2O_3$, $SiO_2$, and $TiO_2$.

The uppermost layer of the thin film encapsulation 210, which is exposed to the outside, may be the inorganic layer 220 which prevents the infiltration of humidity into the organic light-emitting device OLED.

The thin film encapsulation 210 may include at least one sandwich structure in which at least one organic layer is inserted between at least two inorganic layers. The thin film encapsulation 210 may include at least one sandwich structure in which at least one inorganic layer is inserted between at least two organic layers.

In some embodiments, the thin film encapsulation 210 may sequentially include the first inorganic layer 220a, the first organic layer 230a, and the second inorganic layer 220b from the top of the display panel 110. In other embodiments, the, the thin film encapsulation 210 may sequentially include the first inorganic layer 220a, the first organic layer 230a, the second inorganic layer 220b, the second organic layer 230b, and the third inorganic layer 220c from the top of the display panel 110. In some embodiments, the, the thin film encapsulation 210 may sequentially include the first inorganic layer 220a, the first organic layer 230a, the second inorganic layer 220b, the second organic layer 230b, the third inorganic layer 220c, the third organic layer 230c, and a fourth inorganic layer (not shown) from the top of the display panel 110.

A halogenated metal layer (not shown), which can include LiF, may be further included between the display panel 110 and the first inorganic layer 220a. The halogenated metal layer may prevent the display panel 110 from being damaged when the first inorganic layer 220a is formed by sputtering or plasma deposition.

The first organic layer 230a is characterized in that an area of the first organic layer 230a is less than that of the second inorganic layer 220b, and the second organic layer 230b may also have a smaller area than the third inorganic layer 220c. In addition, the first organic layer 230a is characterized in that the first organic layer 230a is fully covered by the second inorganic layer 220b, and the second organic layer 230b may also be fully covered by the third inorganic layer 220c.

The thin film encapsulation 210 may be provided on the color-changing material layer 300 but is not limited thereto. As shown in FIG. 5, the color-changing material layer 300 may be formed by being included in the thin film encapsulation 210. That is, the color-changing material layer 300 may be disposed in the middle of the thin film encapsulation 210 and may function as an organic layer. In other words, when a photochromic material or a thermochromic material is included in the organic layer 230 of the thin film encapsulation 210, the organic layer 230 may function as the color-changing material layer 300. In addition, like the thin film encapsulation 210 that may include a plurality of organic layers, the color-changing material layer 300 may also be formed of a plurality of layers.

When the color-changing material layer 300 is included in the thin film encapsulation 210, the organic light-emitting display 11 does not have to separately include a color-changing material layer 300. Accordingly, the thickness of the organic light-emitting display 11 may be reduced, and a flexible device may be easily implemented. In addition, since manufacture steps may be reduced, production cost may be reduced.

Figure 6:
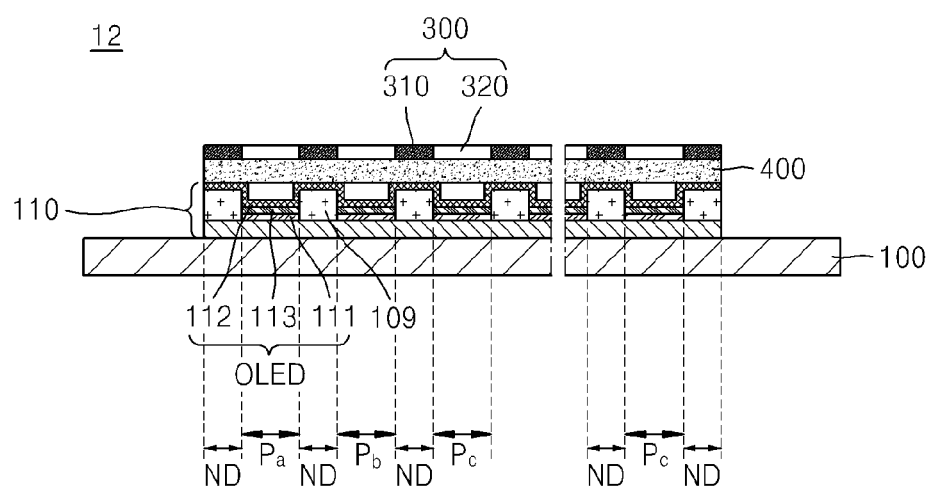
FIG. 6 is a schematic cross-sectional view of an organic light-emitting display.

FIG. 6 is a schematic cross-sectional view of an organic light-emitting display 12. In FIG. 6, like reference numerals in FIG. 1 refer to like members, and thus their repeated description is omitted for convenience of description.

Referring to FIG. 6, compared with the organic light-emitting display 10, the organic light-emitting display 12 differs from the organic light-emitting display 10 in that the organic light-emitting display 12 further includes an external light reflection preventing layer 400.

The external light reflection preventing layer 400 may reduce the reflection of light incident to the organic light-emitting display 12 to improve visibility and contrast.

The external light reflection preventing layer 400 is provided on the display panel 110. Although FIG. 6 shows that the external light reflection preventing layer 400 is disposed between the display panel 110 and the color-changing material layer 300, the present disclosure is not limited thereto. For example, the external light reflection preventing layer 400 may be disposed on the color-changing material layer 300.

The external light reflection preventing layer 400 may be a circular polarization film or a metal-dielectric thin film. The circular polarization film may be formed as a combination of a linear polarization film and a quarter wave plate. The metal-dielectric thin film includes at least one metal layer and at least one dielectric layer and is provided so that light can be interfered and vanished by adjusting the thickness of the dielectric layer.

Figure 7:
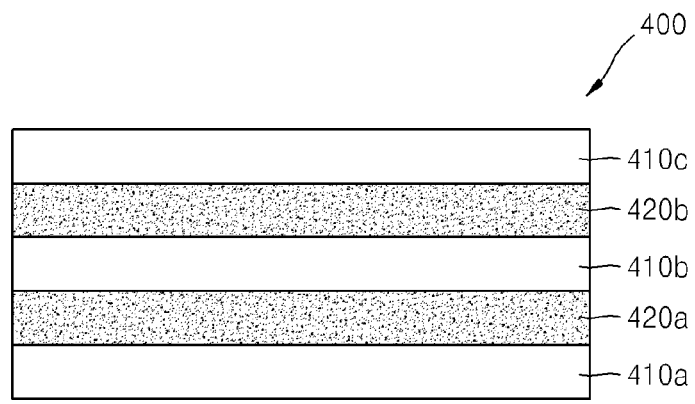
FIG. 7 is a cross-sectional view of an external light reflection preventing layer.

FIG. 7 is a cross-sectional view of the external light reflection preventing layer 400.

Referring to FIG. 7, the external light reflection preventing layer 400 may include first, second, and third dielectric layers 410a, 410b, and 410c and first and second semi-transmissive metal layers 420a and 420b. In some embodiments, the external light reflection preventing layer 400 may include a structure in which the first dielectric layer 410a, the first semi-transmissive metal layer 420a, the second dielectric layer 410b, the second semi-transmissive metal layer 420b, and the third dielectric layer 410c are sequentially stacked. In this case, the second semi-transmissive metal layer 420b and the third dielectric layer 410c may be omitted.

The first, second, and third dielectric layers 410a, 410b, and 410c may be provided for phase matching or phase compensation. The permittivities and thicknesses of the first, second, and third dielectric layers 410a, 410b, and 410c may be designed so that external light reflected from metal layers (e.g., the cathode electrode 112) from which the external light is mainly reflected in the display 12 causes optical vanishing interference with light reflected from the first and second semi-transmissive metal layers 420a and 420b.

The optical vanishing interference described herein refers to a phenomenon that lights reflected from an interface can offset each other when the lights have a phase difference of about 180° therebetween and have the same reflection amplitude. In general, although the optical thicknesses of the first, second, and third dielectric layers 410a, 410b, and 410c may vary according to the variance of optical constants based on metal types, the optical thicknesses of the first, second, and third dielectric layers 410a, 410b, and 410c are basically designed to be near a ¼ wavelength.

At least one of the first dielectric layer 410a, the second dielectric layer 410b, and the third dielectric layer 410c may include any one selected from the group consisting of $SiO_x$ (x≥1), $SiN_x$(x≥1), $MgF_2$, $CaF_2$, $Al_2O_3$, $SnO_2$, ITO, IZO, ZnO, $Ta_2O_5$, $Nb_2O_5$, $HfO_2$, $TiO_2$, and $In_2O_3$. The thickness of the first dielectric layer 410a, the second dielectric layer 410b, and/or the third dielectric layer 410c may be about 30 nm to about 80 nm.

The first semi-transmissive metal layer 420a and/or the second semi-transmissive metal layer 420b may include any one selected from the group consisting of Cr, Ti, Mo, cobalt (Co), Ni, tungsten (W), Al, Ag, Au, Cu, Fe, Mg, and Pt or an alloy thereof.

The thickness of the first semi-transmissive metal layer 420a and/or the second semi-transmissive metal layer 420b may be in the range of from about 6 nm to about 15 nm. If the thickness of the first semi-transmissive metal layer 420a and/or the second semi-transmissive metal layer 420b is less than 6 nm, external light absorbed by a absorption/reflection metal layer may be reduced to increase a reflexibility of the external light, and if the thickness of the first semi-transmissive metal layer 420a and/or the second semi-transmissive metal layer 420b exceeds 15 nm, light emitted by the organic light-emitting device may be reduced to decrease light efficiency.

Since the external light reflection preventing layer 400 using a metal-dielectric thin film may be implemented thinner than a circular polarization film, the thickness of the organic light-emitting display 12 may be thin.

Figure 8:
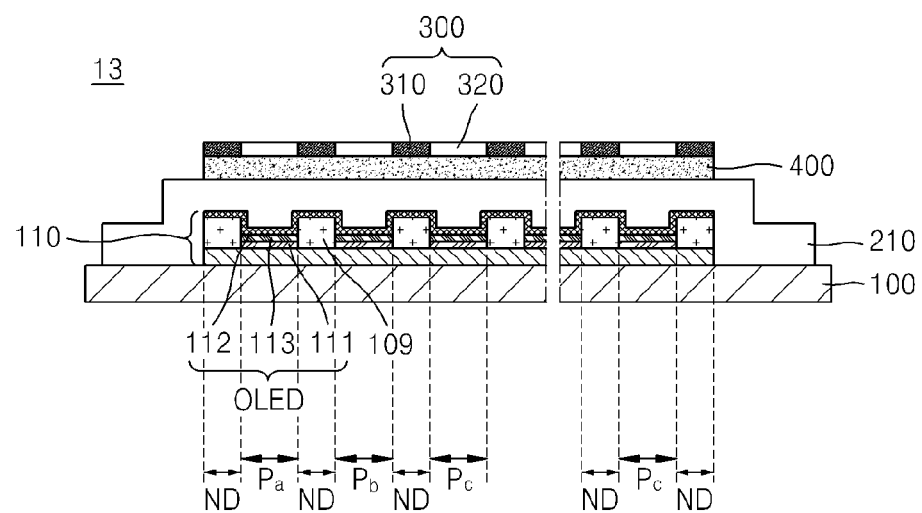
FIG. 8 is a schematic cross-sectional view of an organic light-emitting display.

FIG. 8 is a schematic cross-sectional view of an organic light-emitting display 13 according to another embodiment of the present invention. In FIG. 8, like reference numerals in FIG. 1 refer to like members, and thus their repeated description is omitted for convenience of description.

Referring to FIG. 8, compared with the organic light-emitting display 10, the organic light-emitting display 13 differs from the organic light-emitting display 10 in that the organic light-emitting display 13 further includes the thin film encapsulation 210 and the external light reflection preventing layer 400.

The thin film encapsulation 210 has the same structure as described with reference to FIGS. 3 and 4, and the external light reflection preventing layer 400 has the same structure as described with reference to FIG. 6.

In the organic light-emitting display 13, the color-changing material layer 300 may be formed on the thin film encapsulation 210 to prevent damage from ultraviolet rays Formby forming the light-blocking part 310 of the color-changing material layer 300.

Figure 9:
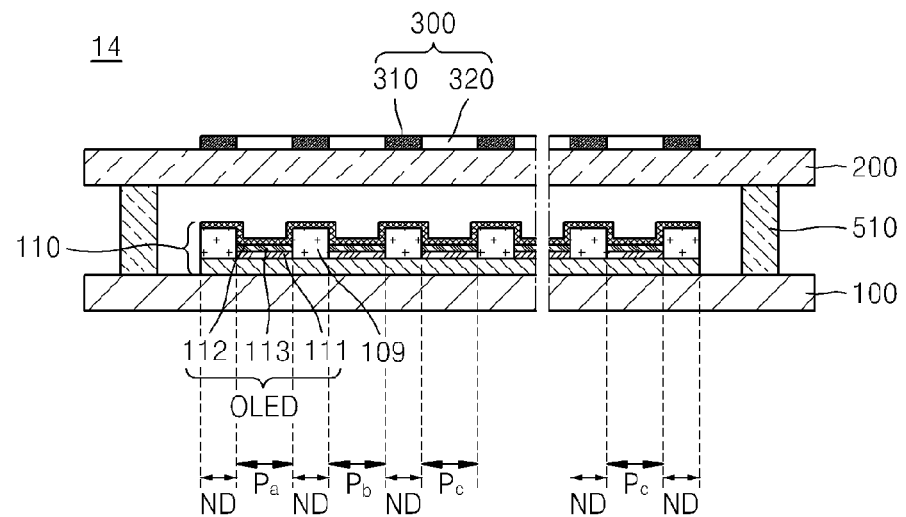
FIG. 9 is a schematic cross-sectional view of an organic light-emitting display.
Figure 10:
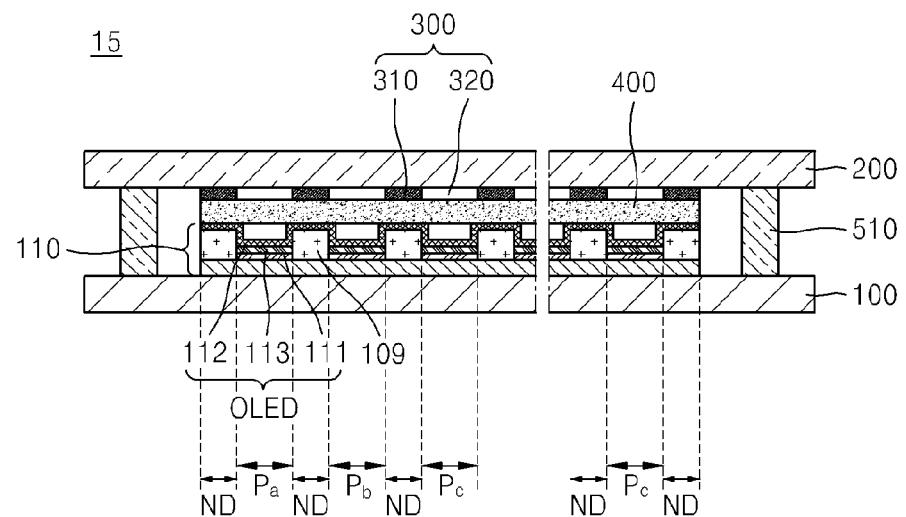
FIG. 10 is a schematic cross-sectional view of an organic light-emitting display.

FIGS. 9 and 10 are schematic cross-sectional views of organic light-emitting displays 14 and 15 according to other embodiments of the present invention. In FIGS. 9 and 10, like reference numerals in FIG. 1 refer to like members, and thus their repeated description is omitted for convenience of description.

Referring to FIG. 9, compared with the organic light-emitting display 10 of FIG. 1, the organic light-emitting display 14 differs from the organic light-emitting display 10 in that the organic light-emitting display 14 further includes the sealing substrate 200 and the sealing member 510.

The sealing substrate 200 is disposed to face the substrate 100 and seals up the display panel 110. The sealing substrate 200 functions to block the display panel 110, including the organic light-emitting device OLED, from external humidity, air, and the like. As the sealing substrate 200, not only a glass substrate but also various plastic substrates, such as acryl, may be used.

The sealing member 510 is disposed to surround the display panel 110 and may function to bond the substrate 100 and the sealing substrate 200. The sealing member 510 may function to block the display panel 110, including the organic light-emitting device OLED, from external humidity, air, and the like. As the sealing member 510, a commonly used material, such as sealing, glass, frit, or the like, may be used.

Although FIG. 9 shows that the color-changing material layer 300 is provided on the sealing substrate 200, the present disclosure is not limited thereto. The color-changing material layer 300 may be provided below the sealing substrate 200. In this case, after the color-changing material layer 300 is formed below the sealing substrate 200, the sealing substrate 200 may be bonded with the substrate 100. Accordingly, the organic light-emitting device may be prevented from being damaged by the irradiation of ultraviolet rays when the color-changing material layer 300 is formed.

In FIG. 10, compared with the organic light-emitting display 14 of FIG. 9, the organic light-emitting display 15 differs from the organic light-emitting display 14 in that the organic light-emitting display 15 further includes the external light reflection preventing layer 400. In FIG. 10, positions of at least one of the external light reflection preventing layer 400 and the color-changing material layer 300 may be variously modified without being limited to the ones of FIG. 10.

When the external light reflection preventing layer 400 and the color-changing material layer 300 are applied together, visibility and contrast may be improved more than when any one of the external light reflection preventing layer 400 and the color-changing material layer 300 is applied separately.

FIGS. 11A to 11D are sequential cross-sectional views illustrating a method of manufacturing the organic light-emitting display 10, 11, 12, 13, 14, or 15. In FIGS. 11A to 11D, a method of manufacturing the organic light-emitting display 10 of FIG. 1 is illustrated.

Figure 11A:
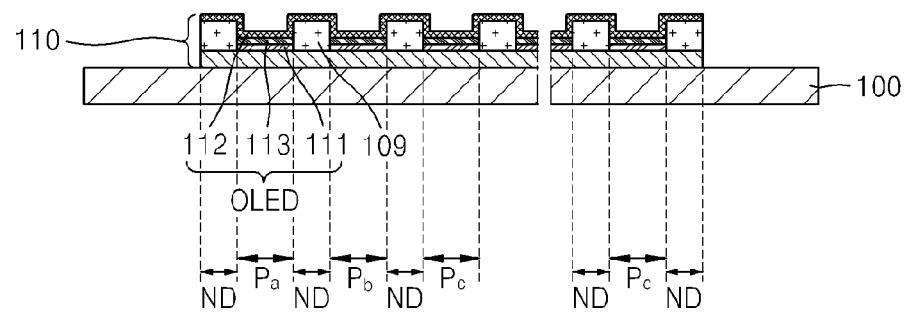
FIGS. 11A to 11D are sequential cross-sectional views illustrating a method of manufacturing an organic light-emitting display.

Referring to FIG. 11A, the display panel 110 is formed on the substrate 100. The display panel 110 includes an emission area (Pa, Pb, and Pc) in which an organic light-emitting device is provided and a non-emission area (ND) that separates the emission area (Pa, Pb, and Pc). To form the organic light-emitting device included in the display panel 110, various masking processes and various deposition methods may be used.

Figure 11B:
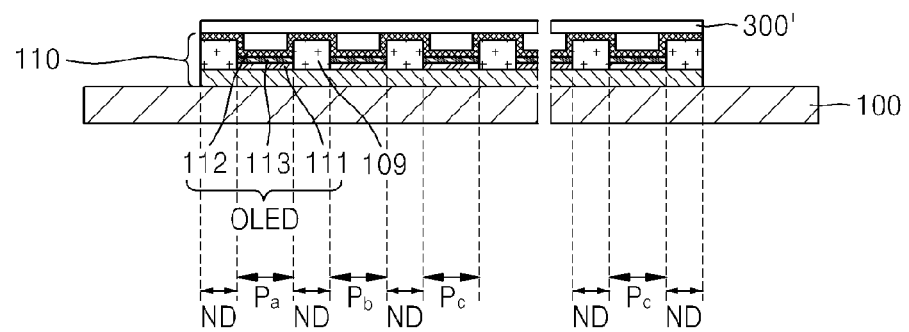

Referring to FIG. 11B, the pre-color changing material layer 300' is formed on the display panel 110. The pre-color-changing material layer 300' may include an irreversible photosensitive or thermochromic material. The pre-color changing material layer 300' may be coated or deposited by flash evaporation, inkjet printing, slot die coating, or the like.

Figure 11C:
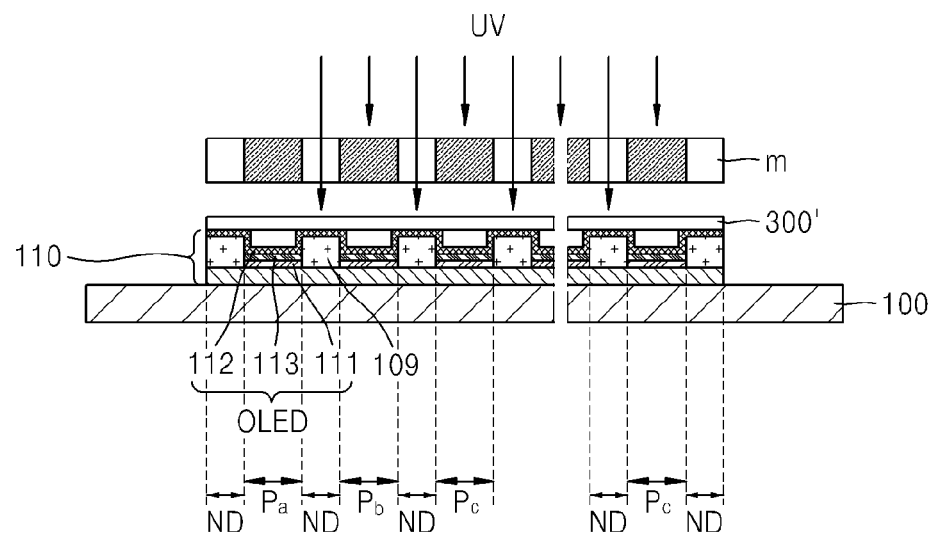

Referring to FIG. 11C, the light-blocking part (310, refer to FIG. 11D) and the light-transmission part (320, refer to FIG. 11D) are formed by exposing only a partial region of the pre-color-changing material layer 300' to ultraviolet rays or heat.

To expose only a partial region to ultraviolet rays or heat, a patterned mask m may be used. When the color-changing material is a positive type, the portion exposed to ultraviolet rays or heat may be the light-blocking part 310, and when the color-changing material is a negative type, the portion exposed to ultraviolet rays or heat may be the light-transmission part 320.

Figure 11D:
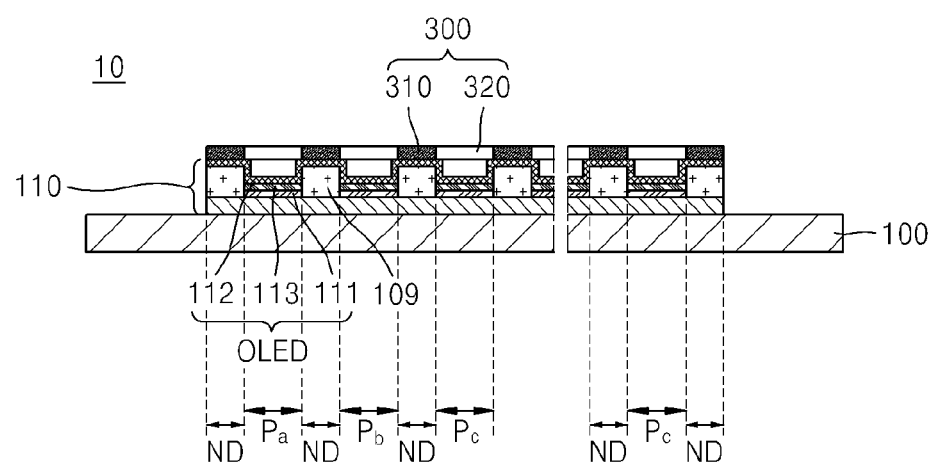

Referring to FIG. 11D, the light-blocking part 310 may be formed to correspond to the non-emission area ND of the display panel 110. As described above, the light-blocking part 310 may be simply formed by applying ultraviolet rays or heat to a selective region of the pre-color-changing material layer 300'.

Also, the organic light-emitting display 10 may further include at least one of the ultraviolet blocking layer 350, the thin film encapsulation 210, the external light reflection preventing layer 400, the sealing substrate 200, and the sealing member 510.

In general, photolithography, etching processes, and the like processes for forming the light-blocking part 310 are complex, and when the etching process is a wet etching process, the organic light-emitting device may be damaged by an etching solution having a high temperature.

In some embodiments, since the light-blocking part 310 may be formed at a low process temperature of 100° C. or less, damage to the organic light-emitting device may be prevented when the light-blocking part 310 is formed. In addition, since a process is simplified, it may be possible to reduce cost and process time.

As described above, an organic light-emitting display comprises a light-blocking part functioning as a black matrix by using a color-changing material layer. Accordingly, the organic light-emitting display may have improved color definition, improved contrast, a simplified manufacturing method, and an organic light-emitting device may be prevented from being damaged during the manufacturing method.

In addition, since the organic light-emitting display may include a thin film encapsulating having a color-changing material layer, a thin display may be implemented.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting display comprising:
a substrate;
a pixel defining layer having an aperture disposed on substrate;
a display panel provided on the substrate, the display panel including an emission area and a non-emission area that separates the emission area by the pixel defining layer; and
a color-changing material layer provided on the display panel,
wherein the color-changing material layer comprises a light-transmission part corresponding to the emission area and a light-blocking part corresponding to the non-emission area.

2. The organic light-emitting display of claim 1, wherein the color-changing material layer has a light transmissivity that irreversibly changes in response to ultraviolet rays irradiation.

3. The organic light-emitting display of claim 1, wherein the color-changing material layer has a light transmissivity that irreversibly changes in response to a temperature between about 80° C. and about 100° C.

4. The organic light-emitting display of claim 1, further comprising an ultraviolet blocking layer on the color-changing material layer.

5. The organic light-emitting display of claim 1, further comprising:
a thin film encapsulation for sealing up the display panel; and
an external light reflection preventing layer on the thin film encapsulation, wherein the color-changing material layer is disposed on the external light reflection preventing layer.

6. The organic light-emitting display of claim 1, wherein the color-changing material layer comprises at least one material selected from the group consisting of diarylethene derivatives, naphthopyran derivatives, polyurethanes, spirobenzopyran compounds, and spiroxazine compounds.

7. The organic light-emitting display of claim 1, further comprising a thin film encapsulation for sealing up the display panel.

8. The organic light-emitting display of claim 7, wherein the thin film encapsulation comprises at least one organic layer or at least one organic layer and at least one inorganic layer, wherein the color-changing material layer is included in the thin film encapsulation.

9. The organic light-emitting display of claim 1, further comprising an external light reflection preventing layer formed on the display panel.

10. The organic light-emitting display of claim 9, wherein the external light reflection preventing layer comprises at least one semi-transmissive metal layer and at least one dielectric layer.

11. The organic light-emitting display of claim 1, further comprising:
    a sealing substrate for sealing up the display panel; and
    a sealing member for bonding the substrate and the sealing substrate.

12. The organic light-emitting display of claim 11, wherein the color-changing material layer is disposed on an upper or a lower surface of the sealing substrate.

13. A method of manufacturing an organic light-emitting display, the method comprising:
    forming a display panel on a substrate, the display panel including an emission area defined by an aperture of a pixel defining layer and a non-emission area that separates the emission area by the pixel defining layer; and
    forming a color-changing material layer on the display panel, the color-changing material layer including a light-transmission part and a light-blocking part,
    wherein the light-transmission part corresponds to the emission area, and the light-blocking part corresponds to the non-emission area.

14. The method of claim 13, wherein the forming of the color-changing material layer comprises:
    forming a pre-color-changing material layer on the display panel; and
    irradiating ultraviolet rays on a selective region of the pre-color-changing material layer.

15. The method of claim 13, wherein the forming of the color-changing material layer, comprises:
    forming a pre-color-changing material layer on the display panel; and
    applying heat to a selective region of the pre-color-changing material layer.

16. The method of claim 13, further comprising forming a thin film encapsulation for sealing up the display panel,
    wherein the forming of the color-changing material layer is included in the forming of the thin film encapsulation.

17. The method of claim 13, further comprising forming an ultraviolet blocking layer on the color-changing material layer.

18. The method of claim 13, further comprising bonding a sealing substrate for sealing up the display panel and the substrate,
    wherein the color-changing material layer is formed on the sealing substrate 19. The method of claim 13, further comprising forming an external light reflection preventing layer on the display panel.

20. The method of claim 19, wherein the external light reflection preventing layer comprises at least one semi-transmissive metal layer and at least one dielectric layer.

* * * * *